United States Patent
Ramachandra et al.

(10) Patent No.: US 9,531,605 B2
(45) Date of Patent: Dec. 27, 2016

(54) DETERMINATION OF RADIATION BEAM PATTERN

(71) Applicant: Telefonaktiebolaget L M Ericsson (publ), Stockholm (SE)

(72) Inventors: Pradeepa Ramachandra, Linköping (SE); Fredrik Athley, Kullavik (SE); Harald Kallin, Sollentuna (SE); Panagiota Lioliou, Sundbyberg (SE); Andreas Nilsson, Göteborg (SE); Kristina Zetterberg, Linköping (SE)

(73) Assignee: TELEFONAKTIEBOLAGET L M ERICSSON (PUBL), Stockholm (SE)

( * ) Notice: Subject to any disclaimer, the term of this patent is extended or adjusted under 35 U.S.C. 154(b) by 9 days.

(21) Appl. No.: 14/420,270

(22) PCT Filed: Feb. 2, 2015

(86) PCT No.: PCT/EP2015/052100
§ 371 (c)(1),
(2) Date: Feb. 6, 2015

(87) PCT Pub. No.: WO2016/124219
PCT Pub. Date: Aug. 11, 2016

(65) Prior Publication Data
US 2016/0226729 A1   Aug. 4, 2016

(51) Int. Cl.
*H04L 12/26* (2006.01)
*H04L 5/00* (2006.01)
(Continued)

(52) U.S. Cl.
CPC ............. *H04L 43/062* (2013.01); *G01R 29/10* (2013.01); *H04B 7/00* (2013.01); *H04L 5/006* (2013.01);
(Continued)

(58) Field of Classification Search
None
See application file for complete search history.

(56) References Cited

U.S. PATENT DOCUMENTS

| | | | |
|---|---|---|---|
| 2003/0114195 A1* | 6/2003 | Chitrapu | H01Q 1/246 455/562.1 |
| 2008/0069058 A1* | 3/2008 | Geng | H04B 7/022 370/336 |

(Continued)

OTHER PUBLICATIONS

International Search Report and Written Opinion of Application No. PCT/EP2015/052100, mailed Oct. 15, 2015, 9 pages.

*Primary Examiner* — Michael J Moore, Jr.
*Assistant Examiner* — Ayanah George
(74) *Attorney, Agent, or Firm* — Nicholson De Vos Webster & Elliot LLP

(57) ABSTRACT

There is provided a method for determining a radiation beam pattern. The method is performed by a network node. The method comprises transmitting probe signals, the probe signals being orthogonal to cell-specific reference signals (CRS) transmitted by the network node. The method comprises receiving responses to the probe signals from wireless devices, wherein each response comprises a measurement report based on reception of the transmitted probe signals at each wireless device. The method comprises determining a radiation beam pattern based on the received measurement reports.

29 Claims, 5 Drawing Sheets

(51) Int. Cl.
*H04W 36/00* (2009.01)
*G01R 29/10* (2006.01)
*H04B 7/00* (2006.01)
*H04B 17/327* (2015.01)

(52) U.S. Cl.
CPC ........ *H04L 5/0007* (2013.01); *H04W 36/0088* (2013.01); *H04B 17/327* (2015.01)

(56) References Cited

U.S. PATENT DOCUMENTS

| | | | |
|---|---|---|---|
| 2010/0311349 A1* | 12/2010 | Koo | H04W 16/02 455/67.11 |
| 2011/0110453 A1* | 5/2011 | Prasad | H04B 7/0695 375/285 |
| 2013/0070719 A1* | 3/2013 | Xu | H04L 5/005 370/329 |
| 2013/0303090 A1 | 11/2013 | Hammarwall et al. | |
| 2013/0315081 A1 | 11/2013 | Kim et al. | |
| 2013/0315083 A1* | 11/2013 | Jung | H04B 7/26 370/252 |
| 2014/0187171 A1* | 7/2014 | Xiao | H04B 7/0617 455/67.11 |
| 2014/0194113 A1 | 7/2014 | Ahlstrom et al. | |
| 2015/0029875 A1* | 1/2015 | Zhu | H04W 76/02 370/252 |
| 2015/0200718 A1* | 7/2015 | Sajadieh | H04L 5/0085 375/267 |

\* cited by examiner

DETERMINATION OF RADIATION BEAM PATTERN

CROSS-REFERENCE TO RELATED APPLICATIONS

This application is a National stage of International Application No. PCT/EP2015/052100, filed Feb. 2,2015, which is hereby incorporated by reference.

TECHNICAL FIELD

Embodiments presented herein relate to radiation beam patterns, and particularly to methods, a network node, computer programs, and a computer program product for determining a radiation beam pattern. Embodiments presented herein further particularly relate to methods, a wireless device, a computer programs, and a computer program product for facilitating determination of a radiation beam pattern.

BACKGROUND

In communications networks, there may be a challenge to obtain good performance and capacity for a given communications protocol, its parameters and the physical environment in which the communications network is deployed.

Future generations cellular communications networks are expected to provide high data rates, up to several Gbps while at the same time be energy efficient. One way to achieve such high data rates and/or to lower the energy consumption in cellular communications networks is to deploy reconfigurable antennas systems (RAS). In general terms, a RAS may be defined as an antenna system whose radiation characteristics can be changed by nodes in the network after deployment, inter alia to be adapted to current traffic needs in the communications network. One common antenna parameter that can be remotely controlled is the antenna tilt. It is foreseen that technology advances may introduce possibilities to modify the antenna lobe shapes, beyond the (one-dimensional) antenna tilt. For example, the antenna system may then be reconfigurable to better serve a traffic hotspot by, inter alia, increasing the antenna gain toward the hotspot location. RAS may be automatically controlled, for example by the use of a sell-organizing network (SON) algorithm. RAS controlled by SON algorithms are hereinafter called RAS-SON.

In general terms, RAS is to be distinguished from beamforming specific for a wireless device (so-called device-specific beamforming). In this respect, RAS is used to shape the cell-specific beam patterns for cell-specific reference signals (CRSs) and control signals, and is typically changed quite slowly, accommodating for changes in the infrastructure or user behaviors, for example on an weekly basis. In contrast, device-specific beamforming is used to shape the beams for device-specific signals and is typically changed very quickly, for example on a millisecond basis.

In order to enable efficient coordinated multi-point (CoMP) schemes future releases of the long-term evolution (LTE) telecommunications standard may enable the possibility to configure wireless devices to report received signal powers based on measurements on a configured set of channel state information-reference signals (CSI-RS) and channel state information-interference measurement (CSI-IM) resources (where the CSI-IM resources corresponds to CSI-RS resources in neighboring cells), see A3GPP TS36.213 V10.4.0, "Evolved Universal Terrestrial Radio Access (E-UTRA); Physical layer procedures". Hereinafter the received signal power measurements based on either CSI-RS or CSI-IM resources are denoted as CSI-RS received power (CSI-RSRP).

It is possible in LTE to obtain path gain measurements between network nodes and wireless devices by using reference signal received power (RSRP) measurements that are based on the CRS signals. The network node can then test different antenna settings, e.g. the tilt, of the CRS signals and request the wireless devices perform RSRP measurements on each of the tilt settings. However, by changing the tilt of the CRS signals, the network node will change the coverage of its cells (i.e., the regions in which the network node provides network coverage) which might lead to dropped users and deteriorated user experience.

Another way to measure path gains for different antenna patterns is to use uplink sounding reference signals (SRS). One issue with this approach is that the network nodes do not know which output power the wireless devices use; hence it is not possible to calculate the path gains. Another issue is that due to the output power control algorithm used by the wireless devices, some of the wireless devices might have very low output power (typically wireless devices close to a serving network node) which will make it difficult for network nodes located far away from the wireless device to perform reliable path gain measurements.

In conclusion, tuning RAS settings for network nodes in a communications network by using SON-algorithms may be very time consuming and can take several weeks for a large area. One reason why it could take so long time is that there exist many different combinations of possible RAS settings in a network and each RAS setting typically needs to be evaluated during quite long time (such as hours or days) in order to gather enough statistics. Moreover, network performance degradations (also called icicles) may occur when evaluating many different combinations of candidate antenna settings.

Hence, there is still a need for an improved determination of antenna settings, such as radiation beam patterns.

SUMMARY

An object of embodiments herein is to provide efficient determination of antenna settings, such as radiation beam patterns.

According to a first aspect there is presented a method for determining a radiation beam pattern. The method is performed by a network node. The method comprises transmitting probe signals, the probe signals being orthogonal to cell-specific reference signals (CRS) transmitted by the network node. The method comprises receiving responses to the probe signals from wireless devices, wherein each response comprises a measurement report based on reception of the transmitted probe signals at each wireless device. The method comprises determining a radiation beam pattern based on the received measurement reports.

Advantageously this provides efficient determination of antenna settings, such as radiation beam patterns.

Advantageously this may enable RAS settings to be tuned fast and without network performance degradation during measurements and evaluations of candidate antenna settings, such as candidate radiation beam patterns.

According to a second aspect there is presented a network node for determining a radiation beam pattern. The network node comprises a processing unit. The processing unit is configured to cause the network node to transmit probe signals, the probe signals being orthogonal to cell-specific reference signals (CRS) transmitted by the network node. The processing unit is configured to cause the network node to receive responses to the probe signals from wireless devices, wherein each response comprises a measurement report based on reception of the transmitted probe signals at each wireless device. The processing unit is configured to cause the network node to determine a radiation beam pattern based on the received measurement reports.

According to a third aspect there is presented a computer program for determining a radiation beam pattern, the computer program comprising computer program code which, when run on a processing unit of a network node, causes the network node to perform a method according to the first aspect.

According to a fourth aspect there is presented a method for facilitating determination of a radiation beam pattern. The method is performed by a wireless device. The method comprises receiving at least one probe signal from a network node, each at least one probe signal being orthogonal to cell-specific reference signals (CRS) transmitted by the network node. The method comprises transmitting a response to the at least one probe signal, wherein the response comprises a measurement report based on reception of the probe signals at the wireless device. The method comprises receiving information of a radiation beam pattern from the network node, wherein the radiation beam pattern is based on the measurement report.

According to a fifth aspect there is presented a wireless device for facilitating determination of a radiation beam pattern. The wireless device comprises a processing unit. The processing unit is configured to cause the wireless device to receive at least one probe signal from a network node, each at least one probe signal being orthogonal to cell-specific reference signals (CRS) transmitted by the network node. The processing unit is configured to cause the wireless device to transmit a response to the at least one probe signal, wherein the response comprises a measurement report based on reception of the probe signals at the wireless device. The processing unit is configured to cause the wireless device to receive information of a radiation beam pattern from the network node, wherein the radiation beam pattern is based on the measurement report.

According to a sixth aspect there is presented a computer program for facilitating determination of a radiation beam pattern, the computer program comprising computer program code which, when run on a processing unit of a wireless device, causes the wireless device to perform a method according to the fourth aspect.

According to a seventh aspect there is presented a computer program product comprising a computer program according to at least one of the third aspect and the sixth aspect and a computer readable means on which the computer program is stored.

It is to be noted that any feature of the first, second, third, fourth, fifth, sixth and seventh aspects may be applied to any other aspect, wherever appropriate. Likewise, any advantage of the first aspect may equally apply to the second, third, fourth, fifth, sixth, and/or seventh aspect, respectively, and vice versa. Other objectives, features and advantages of the enclosed embodiments will be apparent from the following detailed disclosure, from the attached dependent claims as well as from the drawings.

Generally, all terms used in the claims are to be interpreted according to their ordinary meaning in the technical field, unless explicitly defined otherwise herein. All references to "a/an/the element, apparatus, component, means, step, etc." are to be interpreted openly as referring to at least one instance of the element, apparatus, component, means, step, etc., unless explicitly stated otherwise. The steps of any method disclosed herein do not have to be performed in the exact order disclosed, unless explicitly stated.

BRIEF DESCRIPTION OF THE DRAWINGS

The inventive concept is now described, by way of example, with reference to the accompanying drawings, in which.

DETAILED DESCRIPTION

The inventive concept will now be described more fully hereinafter with reference to the accompanying drawings, in which certain embodiments of the inventive concept are shown. This inventive concept may, however, be embodied in many different forms and should not be construed as limited to the embodiments set forth herein; rather, these embodiments are provided by way of example so that this disclosure will be thorough and complete, and will fully convey the scope of the inventive concept to those skilled in the art. Like numbers refer to like elements throughout the description. Any step or feature illustrated by dashed lines should be regarded as optional.

Figure 1:
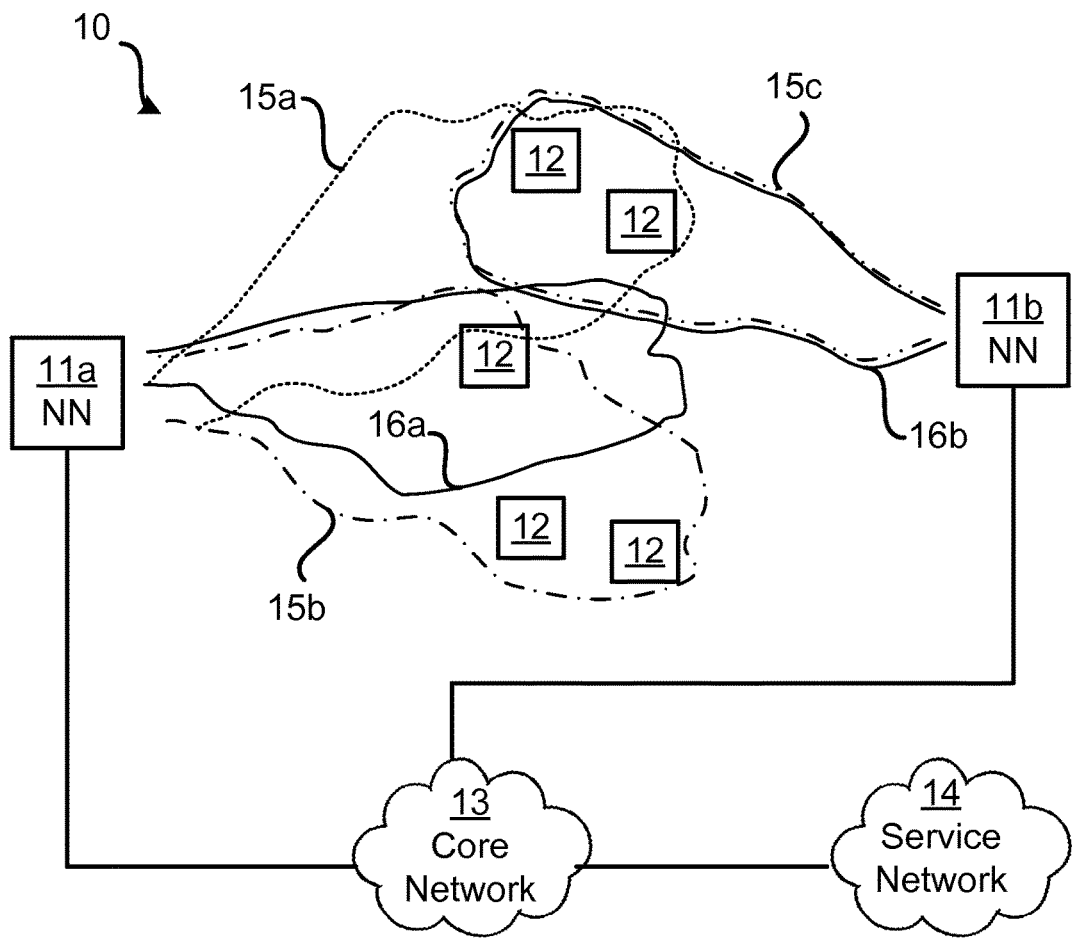
FIG. 1 is a schematic diagram illustrating a communication network according to embodiments.

FIG. 1 is a schematic diagram illustrating a communications network 10 where embodiments presented herein can be applied. The communications network 10 comprises network nodes 11a, 11b. Each network node 11a, 11b provides network coverage for wireless devices 12. The network coverage is defined by regions in which the network node 11a, 11b is enabled to transmit signals to, and receive signals from, the wireless devices 12.

The network nodes 11a, 11b are operatively connected to a core network 13 which, in turn, is operatively connected to a service network 14. A wireless device 12 operatively connected to one of the network nodes 11a, 11b is thereby able to access content and services as provided by the service network 14.

The network nodes 11a, 11b may be provided as any combination of radio access network nodes such as radio base stations, base transceiver stations, node Bs, and evolved node Bs. As the skilled person understands, the communications network 10 may comprise a plurality of network nodes 11a, 11b; the herein disclosed embodiments are not limited to a particular number of network nodes 11a, 11b. Each wireless device 12 may be provided as a portable wireless device such as a mobile station, a mobile phone, a handset, a wireless local loop phone, a user equipment (UE), a smartphone, a laptop computer, a tablet computer, or a wireless sensor device. As the skilled person understands, a plurality of wireless devices 12 could be operatively connected to the network nodes 11a, 11b; the herein disclosed embodiments are not limited to a particular number of wireless devices.

In FIG. 1 transmission beams of the network nodes 11a, 11b are schematically indicated by reference numerals 15a, 15b, 15c and radiation beam patterns of the network nodes 11a, 11b are schematically indicated by reference numerals 16a, 16b. Signals as transmitted in the transmission beams 15a, 15b, 15c may by the wireless devices 12 be used for performing measurements, such as CSI-RSRP measurements. The radiation beam patterns 16a, 16b may be used for transmitting signals, such as CRS, to the wireless devices 12.

At least some gains with RAS can be achieved by only analyzing measurements of path gains between the wireless devices 12 and the network nodes 11a, 11b (assuming all network nodes 11a, 11b operate with the same output power) when optimizing the RAS settings. Path gain is defined as the antenna gain with the path loss subtracted, i.e., path gain=antenna gain−path loss (in dB). One optimization goal could be based on downlink geometry and number of wireless devices 12 operatively connected to each network node 11a, 11b, which has been calculated based on path gains. The geometry for one wireless device 12 may be defined as the worst case signal to interference ratio (SIR) for the wireless device 12. Additionally, or alternatively, the geometry for one wireless device 12 may be defined as the path gain from the network node 11a with the strongest link to the wireless device 12 divided by the sum of the path gains from all other network nodes 11b. The serving network node 11a of a wireless device 12 is the network node with highest path gain (assuming no cell selection offset and identical output power for each network node) to the wireless device 12.

Assume a network node 11a for which the tilt of its antenna system is to be tuned. Then it could be useful for that network node 11a to know the path gains between the network node 11a and the wireless device(s) 12 served by the network node 11a for different tilt settings. In addition, it could be useful for the network node 11a to know the path gains between the network node 11a and other wireless devices 12 operatively connected to neighboring network node 11b, which other wireless devices 12 and/or network nodes 11b could be affected if the tilt change takes place, either through a handover to or from the changed network node 11a, or through a changed interference situation. This path gain information could then be used as a basis for determining a good tilt setting. At least some of the herein disclosed embodiments describes a way to use measurements made by the wireless devices 12, such as CSI-RSRP measurements, for determining how the communications network 10 is affected by a radiation beam pattern change, such as caused by a tilt change, before it takes place.

The embodiments disclosed herein thus relate to determination, and facilitation of determination, of a radiation beam pattern. In order to obtain determination a radiation beam pattern there is provided a network node 11a, 11b, a method performed by the network node 11a, 11b, a computer program comprising code, for example in the form of a computer program product, that when run on a processing unit of the network node 11a, 11b, causes the network node 11a, 11b to perform the method. In order to obtain facilitation of determination of a radiation beam pattern there is further provided a wireless device 12, a method performed by the wireless device 12, and a computer program comprising code, for example in the form of a computer program product, that when run on a processing unit of the wireless device 12, causes the wireless device 12 to perform the method.

Figure 2A:
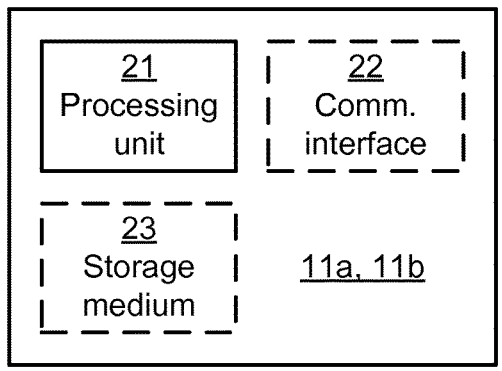
FIG. 2a is a schematic diagram showing functional units of a network node according to an embodiment.

FIG. 2a schematically illustrates, in terms of a number of functional units, the components of a network node 11a, 11b according to an embodiment. A processing unit 21 is provided using any combination of one or more of a suitable central processing unit (CPU), multiprocessor, microcontroller, digital signal processor (DSP), application specific integrated circuit (ASIC), field programmable gate arrays (FPGA) etc., capable of executing software instructions stored in a computer program product 41a (as in FIG. 4), e.g. in the form of a storage medium 23. Thus the processing unit 21 is thereby arranged to execute methods as herein disclosed. The storage medium 23 may also comprise persistent storage, which, for example, can be any single one or combination of magnetic memory, optical memory, solid state memory or even remotely mounted memory. The network node 11a, 11b may further comprise a communications interface 22 for communications with at least one wireless device 12, a further network node, and nodes of the core network 13. As such the communications interface 22 may comprise one or more transmitters and receivers, comprising analogue and digital components and a suitable number of antennas for wireless communications and ports for wireline communications. The processing unit 21 controls the general operation of the network node 11a, 11b e.g. by sending data and control signals to the communications interface 22 and the storage medium 23, by receiving data and reports from the communications interface 22, and by retrieving data and instructions from the storage medium 23. Other components, as well as the related functionality, of the network node 11a, 11b are omitted in order not to obscure the concepts presented herein.

Figure 2B:
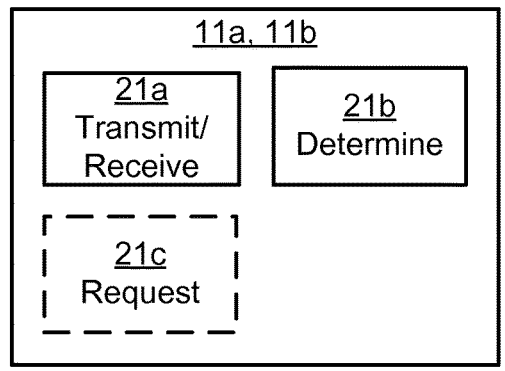
FIG. 2b is a schematic diagram showing functional modules of a network node according to an embodiment.

FIG. 2b schematically illustrates, in terms of a number of functional modules, the components of a network node 11a, 11b according to an embodiment. The network node 11a, 11b of FIG. 2b comprises a number of functional modules; a transmit and/or receive module 21a configured to perform below steps S102, S104, S108, and a determine module 21b configured to perform below step S106. The network node 11a, 11b of FIG. 2b may further comprise optional functional modules, such as a request module 21c configured to perform below steps S102a, S102b, S104a. The functionality of each functional module 21a-c will be further disclosed below in the context of which the functional modules 21a-c may be used. In general terms, each functional module 21a-c may be implemented in hardware or in software. Preferably, one or more or all functional modules 21a-c may be implemented by the processing unit 21, possibly in cooperation with functional units 22 and/or 23. The processing unit 21 may thus be arranged to from the storage medium 23 fetch instructions as provided by a functional module 21a-c and to execute these instructions, thereby performing any steps as will be disclosed hereinafter.

Figure 3A:
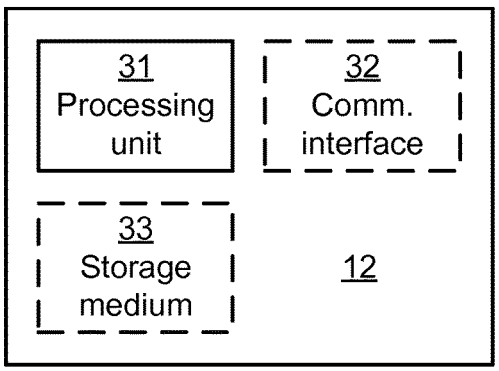
FIG. 3a is a schematic diagram showing functional units of a wireless device according to an embodiment.

FIG. 3a schematically illustrates, in terms of a number of functional units, the components of a wireless device 12 according to an embodiment. A processing unit 31 is provided using any combination of one or more of a suitable central processing unit (CPU), multiprocessor, microcontroller, digital signal processor (DSP), application specific integrated circuit (ASIC), field programmable gate arrays (FPGA) etc., capable of executing software instructions stored in a computer program product 41b (as in FIG. 4), e.g. in the form of a storage medium 33. Thus the processing unit 31 is thereby arranged to execute methods as herein disclosed. The storage medium 33 may also comprise persistent storage, which, for example, can be any single one or combination of magnetic memory, optical memory, solid state memory or even remotely mounted memory. The wireless device 12 may further comprise a communications interface 32 for communications with at least one network node 11a, 11b. As such the communications interface 32 may comprise one or more transmitters and receivers, comprising analogue and digital components and a suitable number of antennas for wireless communications and ports for wireline communications. The processing unit 31 controls the general operation of the wireless device 12 e.g. by sending data and control signals to the communications interface 32 and the storage medium 33, by receiving data and reports from the communications interface 32, and by retrieving data and instructions from the storage medium 33. Other components, as well as the related functionality, of the wireless device 12 are omitted in order not to obscure the concepts presented herein.

Figure 3B:
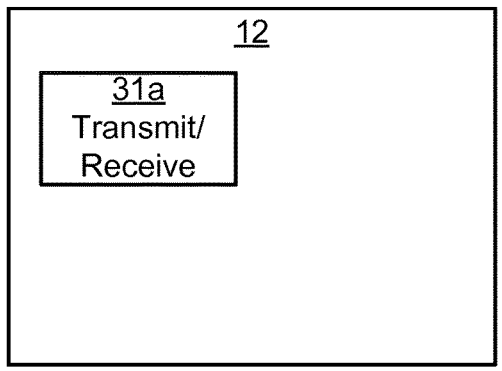
FIG. 3b is a schematic diagram showing functional modules of a wireless device according to an embodiment.

FIG. 3b schematically illustrates, in terms of a number of functional modules, the components of a wireless device 12 according to an embodiment. The wireless device 12 of FIG. 3b comprises a number of functional modules, such as a transmit and/or receive module 31a configured to perform steps S202, S202a, S202b, S204, S204a, S206. The functionality of the functional module 31a will be further disclosed below in the context of which the functional module 31a may be used. In general terms, the functional module 31a may be implemented in hardware or in software. Preferably, the functional module 31a may be implemented by the processing unit 31, possibly in cooperation with functional units 32 and/or 33. The processing unit 31 may thus be arranged to from the storage medium 33 fetch instructions as provided by the functional module 31a and to execute these instructions, thereby performing any steps as will be disclosed hereinafter.

Figure 4:
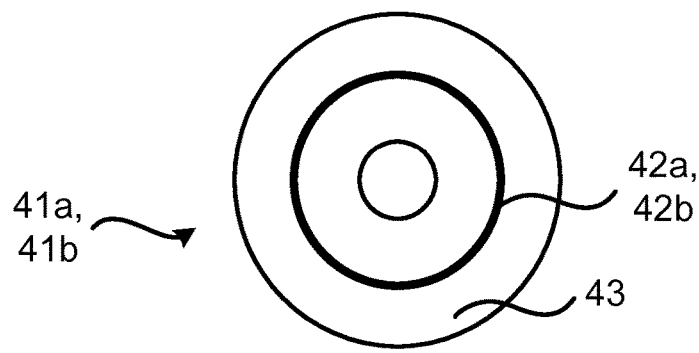
FIG. 4 shows one example of a computer program product comprising computer readable means according to an embodiment.

FIG. 4 shows one example of a computer program product 41a, 41b comprising computer readable means 43. On this computer readable means 43, a computer program 42a can be stored, which computer program 42a can cause the processing unit 21 and thereto operatively coupled entities and devices, such as the communications interface 22 and the storage medium 23, to execute methods according to embodiments described herein. The computer program 42a and/or computer program product 41a may thus provide means for performing any steps of the network node 11a, 11b as herein disclosed. On this computer readable means 43, a computer program 42b can be stored, which computer program 42b can cause the processing unit 31 and thereto operatively coupled entities and devices, such as the communications interface 32 and the storage medium 33, to execute methods according to embodiments described herein. The computer program 42b and/or computer program product 41b may thus provide means for performing any steps of the wireless device 12 as herein disclosed.

In the example of FIG. 4, the computer program product 41a, 41b is illustrated as an optical disc, such as a CD (compact disc) or a DVD (digital versatile disc) or a Blu-Ray disc. The computer program product 41a, 41b could also be embodied as a memory, such as a random access memory (RAM), a read-only memory (ROM), an erasable programmable read-only memory (EPROM), or an electrically erasable programmable read-only memory (EEPROM) and more particularly as a non-volatile storage medium of a device in an external memory such as a USB (Universal Serial Bus) memory or a Flash memory, such as a compact Flash memory. Thus, while the computer program 42a, 42b is here schematically shown as a track on the depicted optical disk, the computer program 42a, 42b can be stored in any way which is suitable for the computer program product 41a, 41b.

Figure 5:
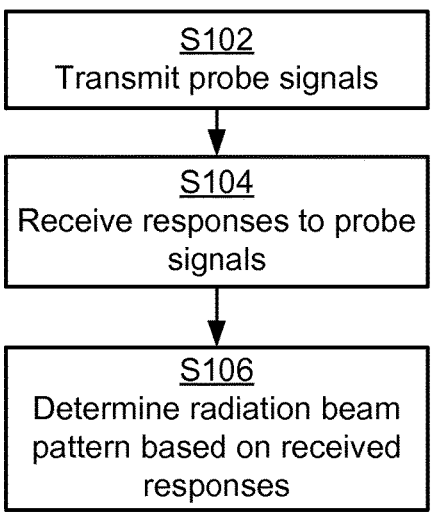
FIGS. 5, 6, 7, 8, 9, and 10 are flowcharts of methods according to embodiments.
Figure 7:
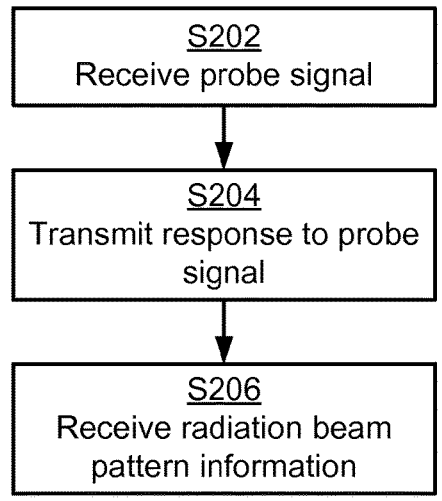
Figure 6:
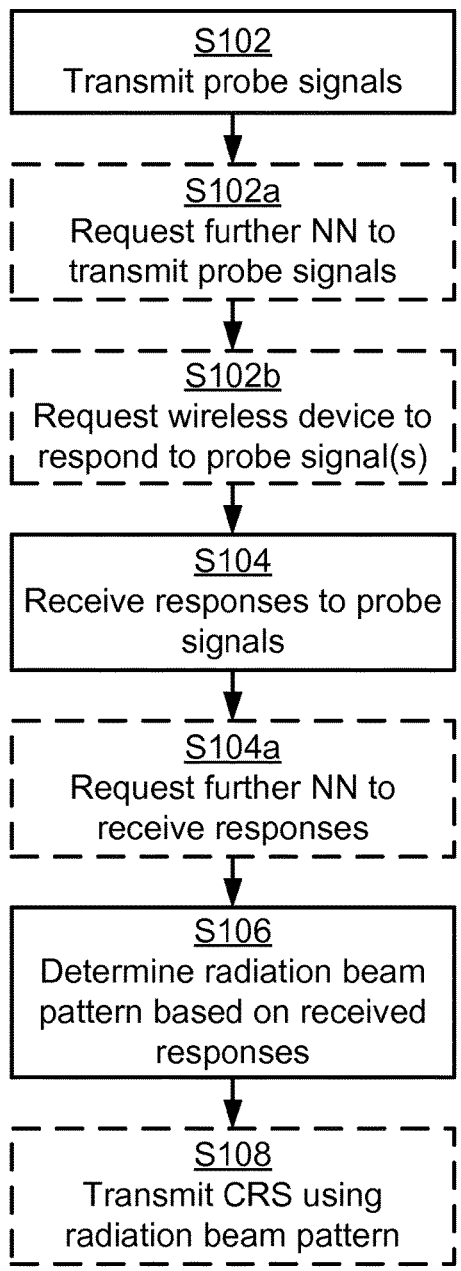
Figure 8:
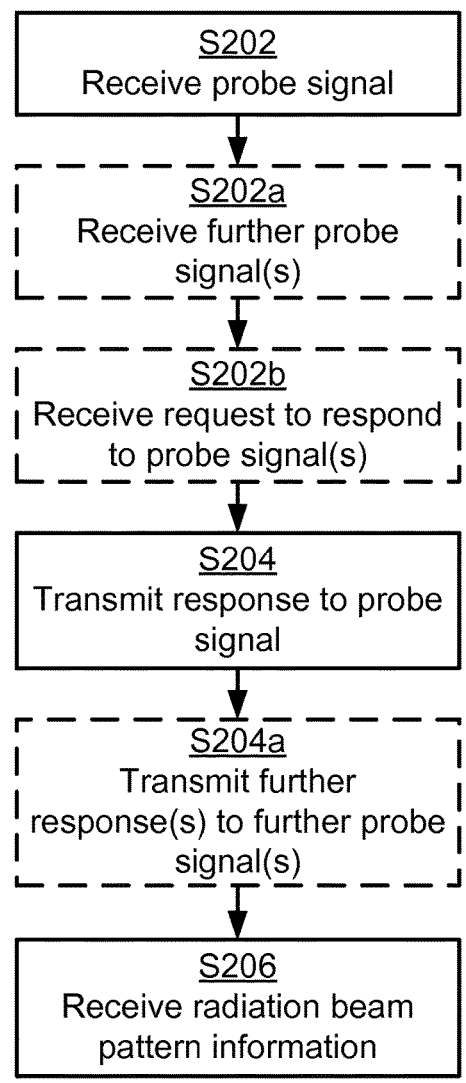

FIGS. 5 and 6 are flow charts illustrating embodiments of methods for determining a radiation beam pattern as performed by the network node 11a, 11b. FIGS. 7 and 8 are flow charts illustrating embodiments of methods for facilitating determination of a radiation beam pattern as performed by the wireless device 12. The methods are advantageously provided as computer programs 42a, 42b.

Reference is now made to FIG. 5 illustrating a method for determining a radiation beam pattern as performed by the network node 11a, 11b according to an embodiment.

The method is based on the network node 11a, 11b acquiring channel measurements from the wireless devices 12. The network node 11a, 11b is therefore configured to in a step S102 transmit probe signals. The method is based on the network node 11a, 11b configuring (almost) non-intrusive measurements from wireless devices 12. Particularly, the probe signals are orthogonal to cell-specific reference signals (CRS), transmitted by the network node 11a, 11b. The probe signals are thereby (almost) non-intrusive with respect to at least the CRS.

As will be further disclosed below, the probe signals are assumed to be received by the wireless devices 12, and the wireless devices 12 are assumed to respond to the probe signals. Hence, the network node 11a, 11b is configured to in a step S104 receive responses to the probe signals from wireless devices 12. The probe signals are, for example, used to estimate path gains between the network node 11a, 11b and the wireless devices 12 for one or more candidate radiation beam pattern. Each response therefore comprises a measurement report based on reception of the transmitted probe signals at each wireless device 12.

The network node 11a, 11b then uses the responses to determine a radiation beam pattern. That is, the network node 11a, 11b is configured to in a step S106 determine a radiation beam pattern based on the received measurement reports. Different ways of how the network node 11a, 11b may determine the radiation beam pattern based on the received measurement reports will be provided below.

Embodiments relating to further details of determining a radiation beam pattern will now be disclosed.

There may be different examples of probe signals that the network node 11a, 11b may transmit in step S102 and different examples of responses to the probe signals that the network node 11a, 11b may receive in step S104. Different embodiments relating thereto will now be described in turn.

For example, the network node 11a, 11b may transmit channel state information-reference signals (CSI-RS). That is, according to an embodiment the probe signals are CSI-RS.

For example, the network node 11a, 11b may receive CRS reference signal received power (CRS-RSRP) from the wireless devices 12. That is, according to an embodiment the responses comprise CRS-RSRP measurement values.

For example, additionally or alternatively, the network node 11a, 11b may receive channel state information reference signal received power (CSI-RSRP). That is, according to an embodiment the responses further comprise CSI-RSRP, measurement values.

For example, additionally or alternatively, the network node 11a, 11b may receive path gain measurements. That is, according to an embodiment each measurement report comprises path gain measurements. The determination of the radiation beam pattern in step S106 may then be based on the path gain measurements.

There may be different ways to perform the determination in step S106. Different embodiments relating thereto will now be described in turn.

For example, the determination may have an impact on handover of one or more wireless devices 12. That is, according to an embodiment determining the radiation beam pattern in step S106 comprises identifying at least one wireless device 12 to be handed over.

For example, the determination may have an impact on throughput or signal to interference and noise ratio (SINR) in the communications network 10.

In general terms, when the network node 11a is to improve the received SINR for the wireless device 12, the network node 11a identifies the radiation beam pattern that increases the path gain to the wireless device 12 to identify the impact of signal quality from the network node 11a. Similar information may be acquired from further wireless devices 12 served by the network node 11a to identify which radiation beam pattern improves the path gain to at least some of the served wireless devices 12 (inter alia wireless devices 12 close to the cell edge, so-called cell edge users) or even all served wireless devices 12. Which wireless devices 12 to consider generally depends on the optimization objective. That is, according to an embodiment determining the radiation beam pattern in step S106 comprises identifying at least one wireless device 12 of the wireless devices 12 for which a new radiation beam pattern provides improved estimated throughput, improved load balance between the network node 11a and at least one further network node 11b, and/or improved signal quality compared to a current radiation beam pattern.

For example, the determination may have an impact on geometry of wireless devices 12 in a neighbour cell. That is, according to an embodiment determining the radiation beam pattern in step S106 comprises identifying impact of geometry of a cell. The impact of geometry of the cell may be identified using the same procedure as described above for improving the SINR but with the objective to optimize performance in terms of geometry instead of the SINR.

There may be different ways to implement the determination of the radiation beam pattern in step S106. For example, the determination of the radiation beam pattern in step S106 may result in a change of azimuth direction, elevation direction, and/or shape. That is, according to an embodiment determining the radiation beam pattern in step S106 comprises determining an azimuth direction (and azimuth shape) and/or an elevation direction (and elevation shape) for an antenna of the network node 11a, 11b.

There may be different ways to determine when, and/or how often to transmit the probe signals in step S102 and/or when, and/or how often to receive the responses in step S104. Different embodiments relating thereto will now be described in turn.

For example, the method for determining a radiation beam pattern as performed by the network node 11a, 11b may be repeated. That is, according to an embodiment the transmitting in step S102, the receiving in step S104, and the determining in step S106 are repeated for at least two candidate CRS radiation beam patterns.

For example, more than one probe signal may be simultaneously transmitted (from the same or different network node 11a, 11b). That is, according to an embodiment the probe signals are simultaneously transmitted in at least two different transmission beams 15a, 15b, 15c.

For example, the probe signals may be sequentially transmitted (from the same or different network node 11a, 11b).

That is, according to an embodiment the probe signals are sequentially transmitted in at least two different transmission beams 15a, 15b, 15c.

Reference is now made to FIG. 6 illustrating methods for determining a radiation beam pattern as performed by the network node 11a, 11b according to further embodiments.

The network node 11a, 11b may instruct the wireless device 12 to send the measurement reports (rather than the wireless device 12 doing so voluntarily). Hence, the network node 11a, 11b may be configured to, in an optional step S102b, request the wireless devices 12 to respond to the probe signals. The request in step S102b may be transmitted either separately or in conjunction with the probe signals in step S102.

There may be different ways for the network node 11a, 11b to act once it has determined the radiation beam pattern in step S106. For example, one use of the determined beam pattern is for transmission of CRS. Hence, the network node 11a, 11b may be configured to, in an optional step S108, transmit CRS to the wireless devices 12 using the determined radiation beam pattern.

As noted above, the network node 11a, 11b, in step S104 receives responses to probe signals transmitted by the network node in step S102. However, the network node 11a, 11b may receive responses also to probe signals not transmitted by the network node 11a, 11b itself, and/or it may receive responses indirectly from another network node. Different embodiments relating thereto will now be described in turn.

It is assumed that the network node 11a serves the wireless devices 12 in a cell. The network node 11a, may then be configured to, in an optional step S104a, request at least one further network node 11b serving the same cell to also receive the responses from the wireless devices 12 and for the at least one further network node 11b to report the responses received by the at least one further network node 11b to the network node 11a.

Further, the network node 11a may request another network node 11b to (also) transmit probe signals (and to receive the responses thereto). That is, the network node 11a, may be configured to, in an optional step S102a, request at least one further network node 11b covering the same cell to transmit further probe signals and for the at least one further network node 11b to receive the responses thereto.

The network node 11a may then make the determination in step S106 also based on any information received from the at least one further network node 11b. The determination in step S106 may be performed only by the network node 11a, or jointly by the network node 11a and at least one further network node 11b. Hence, step S106 may be performed either in a centralized processing unit 21, 31, or distributed in at least two network nodes 11a, 11b. In a distributed implementation, information exchange between the network nodes 11a, 11b would be needed in scenarios where more than one network node 11a, 11b is involved in determination of the radiation beam pattern and/or when the impact of the changes of radiation beam pattern in one cell is evaluated for other wireless devices 12 in other cells as well. Such information exchange could also be beneficial even if only one network node 11a is involved in the radiation beam pattern determination.

There may be different ways for the network node 11a, and the at least one further network node 11b to transmit probe signals and receive responses thereto. Different embodiments relating thereto will now be described in turn.

For example, there may be simultaneous transmission from two or more network nodes 11a, 11b. Hence, according to an embodiment the probe signals transmitted by the network node 11a and the further probe signals transmitted by the at least one further network node 11b are simultaneously transmitted.

For example, there may be sequential transmission from two or more network nodes 11a, 11b. Hence, according to an embodiment the probe signals transmitted by the network node 11a and the further probe signals transmitted by the at least one further network node 11b are sequentially transmitted.

Reference is now made to FIG. 7 illustrating a method for facilitating determination of a radiation beam pattern as performed by the wireless device 12 according to an embodiment.

As noted above, the network node 11a, 11b in step S102 transmits probe signals. It is assumed that at least one probe signals is received by a wireless device 12. Hence, the wireless device 12 is configured to, in a step S202, receive at least one probe signal from a network node 11a, 11b. As noted above, each at least one probe signal is orthogonal to cell-specific reference signals (CRS) transmitted by the network node 11a, 11b.

The wireless device 12 performs a measurement on the received probe signal in order to generate a measurement report and then reports the measurement report back to the network node 11a, 11b. Hence, the wireless device 12 is configured to, in a step S204, transmit a response to the at least one probe signal. The response comprises a measurement report based on reception of the probe signals at the wireless device 11.

As noted above, this response is received by the network node 11a, 11b in step S104, and the network node 11a, 11b then determines and transmits information of a radiation beam pattern 16a, 16b to the wireless device 12. It is assumed that this information is received by the wireless device 12. Hence, the wireless device 12 is configured to, in a step S206, receive information of a radiation beam pattern 16a, 16b from the network node 11a, 11b, wherein the radiation beam pattern is based on the measurement report.

Embodiments relating to further details of facilitating determination of a radiation beam pattern will now be disclosed.

As noted above, there may be different examples of probe signals that the network node 11a, 11b may transmit in step S102 and different examples of responses to the probe signals that the network node 11a, 11b may receive in step S104. Thus, there may be different examples of probe signals that the wireless device 12 may receive in step S202 and different examples of responses to the probe signals that the wireless device 12 may transmit in step S204. Different embodiments relating thereto will now be described in turn.

For example, as noted above, the probe signals transmitted by the network node 11a, 11b in step S102 may be CSI-RS. Hence the at least one probe signal received in step S202 may be CSI-RS.

For example, as noted above, the response received by the network node 11a, 11b in step S104 may comprise CRS-RSRP measurement values. Hence, the response transmitted in step S204 may comprises CRS-RSRP measurement values.

For example, as noted above, the response received by the network node 11a, 11b in step S104 may comprise CSI-RSRP measurement values. Hence, the response transmitted in step S204 may comprises CSI-RSRP measurement values.

For example, as noted above, the response received by the network node 11a, 11b in step S104 may comprise path gain measurements. Hence, the response transmitted in step S204 may comprises path gain measurements. The radiation beam pattern may then be based on the path gain measurements.

As noted above, there may be different ways to determine when, and/or how often to transmit the probe signals in step S102 and/or when, and/or how often to receive the responses in step S104. Thus, there may be different ways for the wireless device 12 to receive the probe signals in step S202 and/or to transmit the responses in step S204. Different embodiments relating thereto will now be described in turn.

For example, the wireless device 12 may be configured for simultaneous reception of probe signals. Thus, the wireless device 12 may be configured to simultaneously receive at least two probe signals in at least two different transmission beams 15a, 15b, 15c.

For example, the wireless device 12 may be configured for sequential reception of probe signals. Thus, the wireless device 12 may be configured to sequentially receive at least two probe signals in at least two different transmission beams 15a, 15b, 15c.

Reference is now made to FIG. 8 illustrating methods for facilitating determination of a radiation beam pattern as performed by the wireless device 12 according to further embodiments.

As noted above, the network node 11a, 11b may instruct the wireless device 12 to send the measurement reports. Hence, the wireless device 12 may be configured to, in an optional step S202b, receive a request from the network node 11a, 11b to transmit the response. The response in step S204 may then be transmitted in response thereto.

As noted above, further probe signals may be transmitted by further network nodes 11b. Hence, the wireless device 12 may be configured to, in an optional step S202a, receive at least one further probe signal from at least one further network node 11b. Each at least one further probe signal is orthogonal to CRS transmitted by the at least one further network node 11b.

The wireless device 12, in line with step 204 above, responds to the at least one further probe signal. Thus, the wireless device 12 performs a measurement on each received at least one further probe signal in order to generate a measurement report to each at least one further probe signal and then reports the measurement reports back to the network nodes 11a, 11b. Hence, the wireless device 12 may be configured to, in an optional step S204a, transmit a respective further response to each of the at least one further probe signal. Each respective response comprises a further measurement report based on reception of a respective one of the at least one further probe signal at the wireless device 12. The responses could either be transmitted to a single network node 11a, or to the network node 11b from which the probe signal was received.

The radiation beam pattern, of which the wireless device 12 receives information in step S206, may then be based also on each further measurement report.

Figure 9:
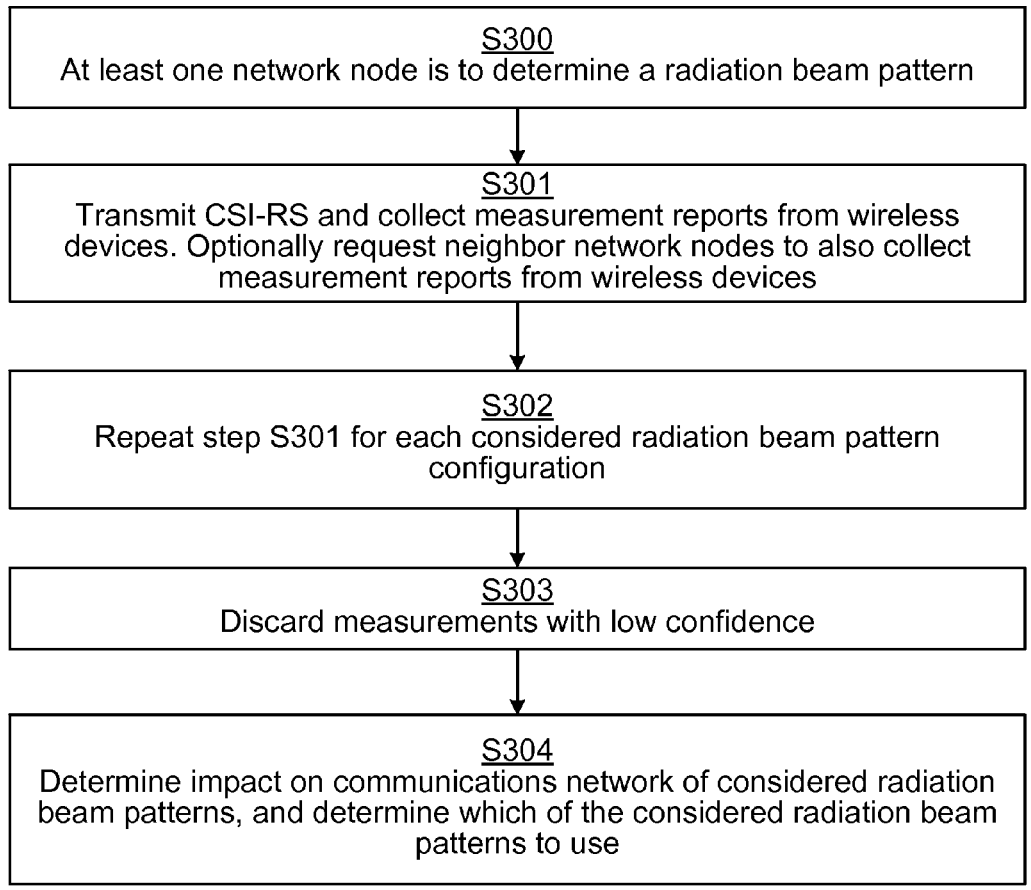

A first particular embodiment for determination of a radiation beam pattern based on at least some of the above disclosed embodiments will now be disclosed in detail with reference to the flow chart of FIG. 9.

In the first embodiment, CSI-RS measurements are performed sequentially in time. One reason for this could for example be that some wireless devices 12 are not capable of measuring multiple CSI-RS processes simultaneously, or that the transmission possibility of numerous CSI-RS is limited.

S300: It is for one or more network nodes 11a, 11b determined that determination of a radiation beam pattern is to be performed.

S301: Each network node 11a, 11b involved in the determination of the radiation beam pattern transmit CSI-RS and instructs wireless devices 12 to measure and report the current CRS-RSRP values and/or CSI-RSRP values, and optionally request its neighbor network nodes to collect and report the CSI-RSRP values to the network node 11a, 11b.

S302: Step S301 is repeated for each considered radiation beam pattern configuration; each network node 11a, 11b involved in the determination of the radiation beam pattern transmits the CSI-RS corresponding to the next considered radiation beam pattern configuration until all CSI-RS has been transmitted for all considered radiation beam pattern configurations.

S303: Measurements with low confidence are discarded.

S304: The received measurements reports are by the network node 11a, 11b used to determine an impact in the communications network 10 of considered radiation beam patterns. The determination may, for example, be based on one or more of the following: identification of a possible handover of wireless devices 12, possible improvement in SINR for the wireless devices 12 in the cells considered for radiation beam pattern configuration, and impact on the geometry for the wireless devices 12 in neighbor cells. Since the measurements are done sequentially in time, there is a risk that wireless devices 12 move or that the radio conditions in the communications network 10 change considerably between the time that the measurements in steps S301 and S302 are performed. In step S303, measurements from such wireless devices 12 could be discarded. This discarding may utilize positioning information gathered from the wireless devices 12 in steps S301 and S302, or by repeating step S301 and removing reports from wireless devices 12 with large changes in the signal strength.

Figure 10:
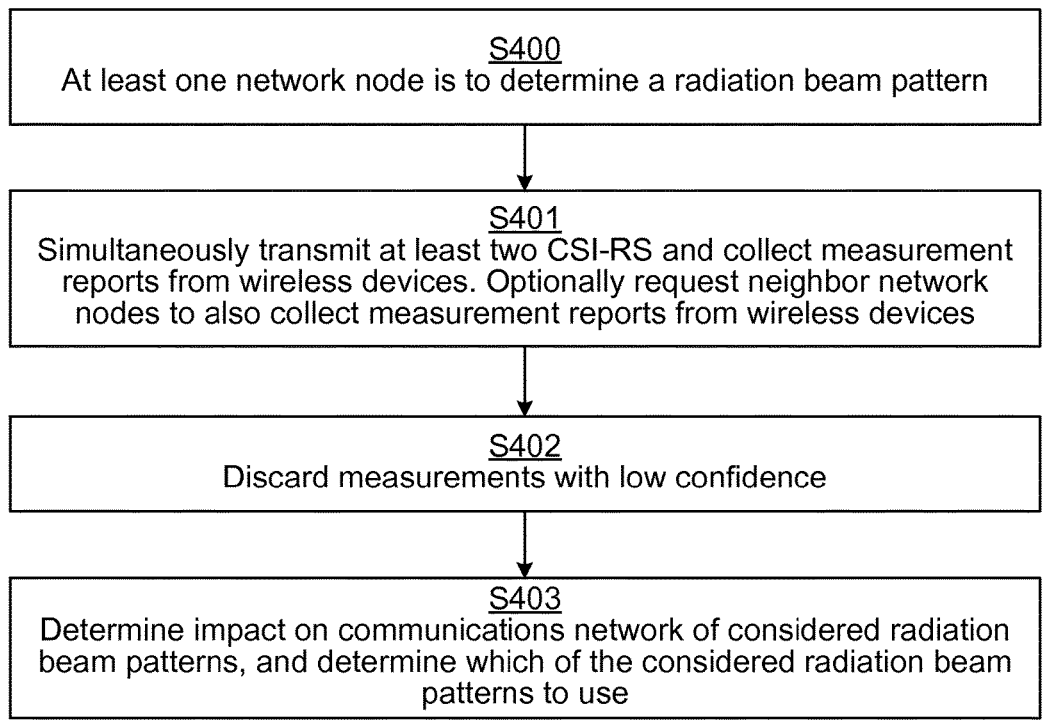

A second particular embodiment for determination of a radiation beam pattern based on at least some of the above disclosed embodiments will now be disclosed in detail with reference to the flow chart of FIG. 10.

In the second particular embodiment, the network nodes 11a, 11b involved in the radiation beam pattern determination transmit CSI-RS corresponding to the considered radiation beam pattern simultaneously, and the wireless devices 12 are requested to measure a set of CSI-RS and report CSI-RSRP to the network nodes 11a, 11b.

S400: It is for one or more network nodes 11a, 11b determined that determination of a radiation beam pattern is to be performed.

S401: The network nodes 11a, 11b involved in the determination of the radiation beam pattern simultaneously transmit CSI-RS for two or more considered radiation beam pattern configurations and instruct wireless devices 12 to measure and report the current CRS-RSRP values and/or CSI-RSRP values of each radiation beam pattern configuration, and optionally request its neighbor network nodes to collect and report the CSI-RSRP values to the network node 11a, 11b.

S402: Measurements with low confidence are discarded.

S403: The received measurements reports are by the network node 11a, 11b used to determine an impact of the possible radiation beam pattern configuration. The determination may, for example, be based on one or more of the following: identification of a possible handover of wireless devices 12, possible improvement in SINR for the wireless devices 12 in the cells considered for radiation beam pattern configuration, and impact on the geometry for the wireless devices 12 in neighbor cells.

Five examples based on at least some of the herein disclosed embodiments will now be presented. The following notation is introduced to simplify the presentation:

Serving_network_node_current_beam=S1={RSRP or CSI-RSRP}
Neighbour_network_node_current_beam=N1={RSRP or CSI-IM}
Serving_network_node_beam2=S2={CSI-RSRP}
Neighbour_network_node_beam2=N2={CSI-IM}

Assume that a wireless device 12 perform measurements on the beams S1, N1 S2, N2, thus resulting in four measurements

FIRST EXAMPLE

Determining Possible Handover Post

Based on the above four measurements, the serving network node 11a will determine whether the wireless device 12 will be handed over to the neighbour network node 11b under consideration or not. The cell individual offset (CIO) is assumed to be zero but any value can be assumed; if the CIO is non-zero it may be added to the measurements from the neighbor network node 11b to check if the handover will take place or not. Once all the four measurements are available, Table 1 (where NN is short for network node) could be used to determine if a change of the radiation beam pattern will result in any handover or not.

TABLE 1

| Combinations of antenna beams between current and neighbour NN | Condition | Serving NN of the wireless device after radiation beam pattern change | Handover |
|---|---|---|---|
| Initial Condition | S1 > N1 | Current NN | NO |
| Keep serving NN's beam S1 and change neighbour NN's beam to N2 | S1 > N2 | Current NN | NO |
| Keep serving NN's beam S1 and change neighbour NN's beam to N2 | N2 > S1 | Neighbour NN | YES |
| Change serving NN's beam to S2 and keep neighbour NN's beam to N1 | S2 > N1 | Current NN | NO |
| Change serving NN's beam to S2 and keep neighbour NN's beam to N1 | S2 < N1 | Neighbour NN | YES |
| Change serving NN's beam to S2 and that of neighbour NN's beam to N2 | S2 > N2 | Current cell | NO |
| Change serving NN's beam to S2 and that of neighbour NN's beam to N2 | N2 > S2 | Neighbour cell | YES |

SECOND EXAMPLE

Estimation of Improvement/Degradation in the Signal Quality from the Serving Network Node By comparing the before after values of the signal strength from the serving network node, it can be determined if it the wireless device 12 will experience direct benefits (non scheduling related) from the change in serving network node beam, see Table 2.

TABLE 2

| | Change in signal quality for wireless device |
|---|---|
| S1 > S2 | Degrades if new beam is used |
| S2 > S1 | Improves if new beam is used |

THIRD EXAMPLE

Estimation of Increase/Decrease of Interference from the Neighbor Network Node(s) Under Consideration By comparing the before after values of the signal strength from the neighbor network node, it can be determined if the wireless device will experience reduced interference from the change in neighbor cell beam, see Table 3.

TABLE 3

| | Changes in interference |
|---|---|
| N1 > N2 | Reduces the interference |
| N2 > N1 | Increases the interference |

FOURTH EXAMPLE

Calculation of Geometry for Determining the Impact of Idle Mode Wireless Devices By determining the geometry values based on the CSI-RSRP and CSI-IM measurements, it may be pre-checked if the modified beams (resulting from the determined radiation beam pattern) result in regions with bad geometry; i.e., in regions where the SINR on the control channel will be so low that initial access of a wireless device will not be possible. This may ensure a −4 dB coverage in geometry for coverage of so-called 'waking up wireless devices'.

FIFTH EXAMPLE

Removal of Antenna Change Directions from the Evaluations

The measurements in at least one of the first, second, third, and fourth examples may first be carried out at wireless device level. Several such measurements may then be combined for all the wireless devices served by a network node 11a, 11b to determine which radiation beam patterns in the network node 11a, 11b and any neighbor network node can be used during the determination of which radiation beam pattern to use.

One use case will now be presented with reference again to FIG. 1.

Assume for non-limiting and illustrative purposes that two network nodes 11a, 11b cover a high rise building. The CRS beams for each respective network node 11a, 11b are indicated at reference numerals 16a, 16b. Assume that the CRS beam for a first network node 11a is to be adapted in order to increase the performance of the wireless devices 12.

A number of CSI-RSRP measurements for three different transmission beams, as indicated by reference numerals 15a, 15b, 15c, are made. Transmission beam 15a and transmission beam 15b are two potential new transmission beams that are to be evaluated for the first network node 11a. Transmission beam 15c is a transmission beam of the second network node 11b and is only used to obtain path gain measurements.

A set of CSI-RSRP measurements are configured for the three different transmission beams 15a, 15b, 15c. Using the first particular embodiment, the CSI-RS beams 15a, 15b from network node 11a are sequentially transmitted and measured on one at the time. Using the second particular embodiment, CSI-RS beams 15a, 15b from network node 11a are simultaneously transmitted and measured on. Network node 11b has only one CSI-RS beam 15c to transmit. This CSI-RS beam 15c may be transmitted either simultaneously as one or more of the CSI-RS beams 15a, 15b or sequentially in relation to the CSI-RS beams 15a, 15b.

The network nodes 11a, 11b thus transmit the three CSI-RSRP beams 15a, 15b, 15c and the wireless devices 12 perform measurements and report these to their serving network node 11a, 11b. Measurements with low confidence, for example due to large movements of wireless devices 12 in the sequential measurements embodiment, may be discarded.

Assume that there are now path gain measurements obtained between both base network nodes 11a, 11b and all wireless devices 12 for all three transmission beams 15a, 15b, 15c. These path gain measurements are collected, for example at the serving network node 11a, 11b for each wireless device 12, and may then be used for evaluating how to tune the CRS beam for, for example, the first network node 11a.

The inventive concept has mainly been described above with reference to a few embodiments. However, as is readily appreciated by a person skilled in the art, other embodiments than the ones disclosed above are equally possible within the scope of the inventive concept, as defined by the appended patent claims.

The invention claimed is:

1. A method for determining a radiation beam pattern, the method being performed by a network node that serves wireless devices in a cell, the method comprising:
   transmitting probe signals, the probe signals being orthogonal to cell-specific reference signals (CRS) transmitted by the network node;
   receiving responses to the probe signals from the wireless devices, wherein each response includes a measurement report based on reception of the transmitted probe signals at each wireless device;
   requesting at least one further network node serving the same cell to also receive the responses from the wireless devices and to report the responses received by the at least one further network node to the network node; and
   determining a radiation beam pattern based on the received measurement reports and the responses received by the at least one further network node.

2. The method according to claim 1, wherein the probe signals are channel state information-reference signals (CSI-RS).

3. The method according to claim 1, wherein the responses comprise CRS reference signal received power (CRS-RSRP) measurement values.

4. The method according to claim 3, wherein the responses further comprise channel state information reference signal received power (CSI-RSRP) measurement values.

5. The method according to claim 1, wherein each measurement report comprises path gain measurements, and wherein determining the radiation beam pattern is based on the path gain measurements.

6. The method according to claim 1, wherein determining the radiation beam pattern comprises identifying at least one wireless device to be handed over.

7. The method according to claim 1, wherein determining the radiation beam pattern comprises identifying at least one wireless device of the wireless devices for which a new radiation beam pattern provides at least one of an improved estimated throughput, an improved load balance between network nodes, and an improved signal quality compared to a current radiation beam pattern.

8. The method according claim 1, wherein determining the radiation beam pattern comprises identifying an impact of a geometry of a cell.

9. The method according to claim 1, wherein determining the radiation beam pattern comprises determining an azimuth direction and a shape and an elevation direction and a shape for an antenna of the network node.

10. The method according to claim 1, wherein said transmitting, said receiving, and said determining are repeated for at least two candidate CRS radiation beam patterns.

11. The method according to claim 1, wherein the probe signals are simultaneously transmitted in at least two different transmission beams.

12. The method according to claim 1, wherein the probe signals are sequentially transmitted in at least two different transmission beams.

13. The method according to claim 1, further comprising:
transmitting CRS to the wireless devices using the determined radiation beam pattern.

14. The method according to claim 1, wherein the network node serves the wireless devices in a cell, the method further comprising:
requesting at least one further network node covering the same cell to transmit further probe signals and to receive the responses thereto.

15. The method according to claim 14, wherein the probe signals and the further probe signals are simultaneously transmitted.

16. The method according to claim 14, wherein the probe signals and the further probe signals are sequentially transmitted.

17. The method according to claim 1, further comprising:
requesting the wireless devices to respond to the probe signals.

18. A method for facilitating determination of a radiation beam pattern, the method being performed by a wireless device that is served in a cell by a network node, the method comprising:
receiving at least one probe signal from a network node, each one of the at east one probe signal being orthogonal to cell-specific reference signals (CRS) transmitted by the network node;
transmitting a response to the at least one probe signal, wherein the response includes a measurement report based on reception of the probe signals at the wireless device;
receiving at least one further probe signal from at least one further network node, each one of the at least one further probe signal being orthogonal to CRS transmitted by the at least one further network node;
transmitting a respective further response to each of the at least one further probe signal, wherein each respective response comprises a further measurement report based on reception of a respective one of the at least one further probe signal at the wireless device; and
receiving information of a radiation beam pattern from the network node, wherein the radiation beam pattern is based on the measurement report and on each further measurement report.

19. The method according to claim 18, wherein the at least one probe signal are channel state information-reference signals (CSI-RS).

20. The method according to claim 18, wherein the response comprises CRS reference signal received power (CRS-RSRP)measurement values.

21. The method according to claim 20, wherein the response further comprises channel state information reference signal received power (CSI-RSRP) measurement values.

22. The method according to claim 18, wherein the measurement report comprises path gain measurements, and wherein the radiation beam pattern is based on the path gain measurements.

23. The method according to claim 18, wherein at least two probe signals are received, and wherein the at least two probe signals are simultaneously received in at least two different transmission beams.

24. The method according to claim 18, wherein at least two probe signals are received, and wherein the at least two probe signals are sequentially received in at least two different transmission beams.

25. The method according to claim 18, further comprising:
receiving a request from the network node to transmit the response, and wherein the response is transmitted in response thereto.

26. A network node for determining a radiation beam pattern, the network node comprising:
a processing unit, the processing unit being configured to cause the network node to:
transmit probe signals, the probe signals being orthogonal to cell-specific reference signals (CRS) transmitted by the network node,
receive responses to the probe signals from wireless devices, wherein each response comprises a measurement report based on reception of the transmitted probe signals at each wireless device,
request at least one further network node serving the same cell to also receive the responses from the wireless devices and to report the responses received by the at least one further network node to the network node, and
determine a radiation beam pattern based on the received measurement reports and the responses received by the at least one further network node.

27. A wireless device for facilitating determination of a radiation beam pattern, the wireless device comprising:
a processing unit, the processing unit being configured to cause the wireless device to: receive at least one probe signal from a network node, each one of the at least one probe signal being orthogonal to cell-specific reference signals (CRS) transmitted by the network node,
transmit a response to the at least one probe signal, wherein the response comprises a measurement report based on reception of the probe signals at the wireless device, receive at least one further probe signal from at east one further network node, each one of the at least one further probe signal being orthogonal to CRS transmitted by the at least one further network node, transmit a respective further response to each of the at least one further probe signal, wherein each respective response comprises a further measurement report on a reception of a respective one of the at least one further probe signal at the wireless device, and receive information of a radiation beam pattern from the network node, wherein the radiation beam pattern is based on the measurement report and on each further measurement report.

28. A non-transitory computer readable medium storing a computer program for determining a radiation beam pattern, the computer program comprising computer code which, when ran on a processing unit of a network node, causes the network node to:

transmit probe signals, the probe signals being orthogonal to cell-specific reference signals (CRS) transmitted by the network node;

receive responses to the probe signals from wireless devices, wherein each response includes a measurement report based on reception of the transmitted probe signals at each wireless device; and request at least one further network node serving the same cell to also receive the responses from the wireless devices and to report the responses received by the at least one further network node to the network node; and determine a radiation beam pattern based on the received measurement reports and the responses received by the at least one further network node.

29. A non-transitory computer readable medium storing a computer program for facilitating determination of a radiation beam pattern, the computer program comprising computer code which, when run on a processing unit of a wireless device, causes the wireless device to:

receive at least one probe signal from a network node, each one of the at least one probe signal being orthogonal to cell-specific reference signals (CRS) transmitted by the network node;

transmit a response to the at least one probe signal, wherein the response includes a measurement report based on reception of the probe signals at the wireless device;

receive at least one further probe signal from at least one further network node, each one of the at least one further probe signal being orthogonal to CRS transmitted by the at least one further network node;

transmit a respective further response to each of the at least one further robe signal, wherein each respective response comprises a further measurement report based on reception of a respective one of the at least one further probe signal at the wireless device; and receive information of a radiation beam pattern from the network node, wherein the radiation beam pattern is based on the measurement report and on each further measurement report.

* * * * *

UNITED STATES PATENT AND TRADEMARK OFFICE
CERTIFICATE OF CORRECTION

Page 1 of 2

PATENT NO. : 9,531,605 B2
APPLICATION NO. : 14/420270
DATED : December 27, 2016
INVENTOR(S) : Ramachandra et al.

It is certified that error appears in the above-identified patent and that said Letters Patent is hereby corrected as shown below:

On the Title Page

Item [74], under "Attorney, Agent, or Firm", in Column 2, Line 2, delete "Elliot" and insert -- Elliott --, therefor.

In the Specification

Column 1, Line 8, delete "Feb. 2,2015," and insert -- Feb. 2, 2015, --, therefor.

Column 1, Line 45, delete "sell-organizing" and insert -- self-organizing --, therefor.

Column 1, Lines 66-67, delete "A3GPP TS36.213" and insert -- 3GPP TS 36.213 --, therefor.

Column 14, Line 13, delete "N1" and insert -- N1, --, therefor.

In the Claims

Column 17, Line 19, Claim 8, delete "according" and insert -- according to --, therefor.

Column 17, Line 59, Claim 18, delete "east" and insert -- least --, therefor.

Column 18, Line 17, Claim 20, delete "(CRS-RSRP)measurement" and insert -- (CRS-RSRP) measurement --, therefor.

Column 19, Line 1, Claim 27, delete "east" and insert -- least --, therefor.

Signed and Sealed this
Tenth Day of October, 2017

Joseph Matal
*Performing the Functions and Duties of the*
*Under Secretary of Commerce for Intellectual Property and*
*Director of the United States Patent and Trademark Office*

CERTIFICATE OF CORRECTION (continued)
U.S. Pat. No. 9,531,605 B2

Column 19, Lines 7-8, Claim 27, delete "report on a reception" and insert -- report based on reception --, therefor.

Column 20, Line 21, Claim 29, delete "robe" and insert -- probe --, therefor.